(12) United States Patent
Lee et al.

(10) Patent No.: US 7,619,915 B2
(45) Date of Patent: Nov. 17, 2009

(54) RESISTIVE RANDOM ACCESS MEMORY DEVICE

(75) Inventors: Jung-hyun Lee, Yongin-si (KR); Hyung-jin Bae, Seoul (KR); Sang-jun Choi, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 182 days.

(21) Appl. No.: 11/979,894

(22) Filed: Nov. 9, 2007

(65) Prior Publication Data

US 2008/0157055 A1  Jul. 3, 2008

(30) Foreign Application Priority Data

Nov. 15, 2006 (KR) .................. 10-2006-0113042

(51) Int. Cl.
 *H01L 47/00* (2006.01)
(52) U.S. Cl. .................. 365/148; 257/4; 257/E29.323
(58) Field of Classification Search .................. 257/2, 257/4, 5, 295, E29.323, E47.001; 365/148
 See application file for complete search history.

(56) References Cited

U.S. PATENT DOCUMENTS

2006/0054950 A1* 3/2006 Baek et al. .................. 257/295
2006/0175598 A1* 8/2006 Krieger et al. .................. 257/4

* cited by examiner

*Primary Examiner*—Sue Purvis
*Assistant Examiner*—Scott Stowe
(74) *Attorney, Agent, or Firm*—Harness, Dickey & Pierce, P.L.C.

(57) ABSTRACT

Provided is a resistive random access memory (RRAM) device having a switching device and a storage node connected to the switching device, the storage node including a first electrode formed of a metal compound, the metal compound including metal with no more than a divalence and a metal compound having anions, a solid electrolyte layer formed on the first electrode, and a second electrode formed on the solid electrolyte layer.

12 Claims, 3 Drawing Sheets

RESISTIVE RANDOM ACCESS MEMORY DEVICE

PRIORITY CLAIM

A claim of priority is made to Korean Patent Application No. 10-2006-0113042, filed on Nov. 15, 2006 in the Korean Intellectual Property Office, the disclosure of which is incorporated herein in its entirety by reference.

BACKGROUND

1. Field

Example embodiments of the present invention may relate to a semiconductor memory device, and more particularly, to a resistive random access memory (RRAM) device.

2. Description of the Related Art

A resistive random access memory (RRAM) is a device having a variable resistive material, for example, a transition metal oxide. A variable resistive material has varying resistance depending on voltages applied thereto. When a voltage equal to or greater than a set voltage is applied to the variable resistive material, the resistance of the variable resistive material decreases, which is known as an ON state. Also, when a voltage equal to or greater than a reset voltage is applied to the variable resistive material, the resistance of the variable resistive material increases, which is known as an OFF state.

The conventional RRAM includes a storage node in which a lower electrode, a resistance variation layer, and an upper electrode are sequentially stacked. The RRAM usually includes a nickel oxide ($NiO_X$) layer as the resistance variation layer. The conventional RRAM has two distinctively different resistance states. However, a disadvantage of the conventional RRAM is that the distribution of the voltage, at which the two resistance states change, is too broad. When the distribution of the voltage at which the resistance changes is too broad, it is difficult to obtain a resistance variation within a limited voltage range, because the resistance variation layer should have the same resistance state at the same voltage. However, the resistance variation layer may not have the same resistance state at the same voltage. Thus, the reliability of the conventional RRAM may be lowered.

In order to improve the RRAM, an RRAM having a storage node with a different composition has been introduced.

The storage node of this RRAM includes a lower electrode formed of copper (Cu) or silver (Ag), an upper electrode formed of platinum (Pt), and a solid electrolyte layer such as a CuS layer as a resistance variation layer formed between the lower electrode and the upper electrode. In the conventional RRAM, a current path may be formed in the solid electrolyte layer or the current path may be cut off depending on a voltage applied to the upper electrode and the lower electrode. The formation of the current path is due to Cu ions or Ag ions diffusing from the lower electrode into the solid electrolyte layer. The conventional RRAM is on or off depending on the presence of the current path. The voltage distribution of the RRAM is narrower than the previous RRAM.

However, in the RRAM, Cu ions or Ag ions are diffused into the solid electrolyte layer at such a high rate that the operation voltage of the conventional RRAM is too low.

FIG. 1 is a graph illustrating current-voltage characteristics of the RRAM. In FIG. 1, a section T1 illustrates where the current abruptly changes, that is, where the resistance abruptly changes.

Referring to FIG. 1, the resistance changes at about −0.3 V, indicating that the absolute value of the operation voltage of the RRAM is about 0.3 V. Therefore, since the operation voltage of the RRAM is very low, it is difficult to control the operation of the RRAM.

Also, in the case of a highly integrated device in which a size of a storage node is at a sub-micro level, a division between an upper electrode and a lower electrode vanishes due to excessive diffusion of the Cu ions or Ag ions from the lower electrode to the upper electrode, which may cause a malfunction of the highly integrated device.

In addition, Cu and Ag cannot be patterned using conventional etching methods such as a reactive ion etching (RIE) due to the characteristics of Cu and Ag, and thus it is very difficult to manufacture the RRAMs in which Cu or Ag is used to form the lower electrode.

SUMMARY

Example embodiments of the present invention may provide a resistive memory device including a storage node that may be manufactured using a conventional etching method, wherein excessive ion diffusion from an electrode material, for example, Cu or Ag having low ionization energy into a resistance variation layer is prevented.

In an example embodiment of present invention, there is provided a resistive random access memory (RRAM) device having a switching device and a storage node connected to the switching device, the storage node may include a first electrode formed of a metal compound, the metal compound including metal with no more than a divalence and a metal compound having anions, a solid electrolyte layer formed on the first electrode, and a second electrode formed on the solid electrolyte layer.

The first electrode may be a nanocomposite, and an amount (X) of the metal in the nanocomposite may be 15≦X<100 atomic %. Further the thickness of the nanocomposite may be 100 to 1000 Å. The first electrode may also be a nanolaminate. The nanolaminate may be alternately formed of a metal layer and a metal compound layer, the metal layer formed of the metal and the metal compound layer formed of the metal compound.

A first layer of the nanolaminate may be formed of the metal compound layer, and a last layer of the nanolaminate may be formed of the metal layer. Also, the least two layers of the nanolaminate may be formed of the metal layer. The metal of the first electrode may be one of Cu, Ag, Zn and Li. The metal compound of the first electrode may be a metal nitride, and the metal nitride may be one of TaN, TiN and Zn. The metal compound of the first electrode may be a metal oxide, and the metal oxide may be one of $RuO_2$ and $ZrO_2$. The metal compound may be a metal compound layer, the metal compound layer may have a groove formed therein, and the metal fills at least a portion of the groove. The first electrode and the second electrode are wires crossing each other in right angles.

The solid electrolyte layer may be one of a metal compound and at least a trivalence metal oxide. The metal compound may be one of S, Se and Te, and the metal oxide may be one of $AlO_X$ and $WO_3$.

The second electrode may be formed of metal. The metal of the second electrode may be one of Pt, Ru and $IrO_2$.

In another example embodiment, a resistive random access memory (RRAM) device may include a transistor formed on a substrate, and a storage node electrically connected to the transistor. The storage node including a first electrode formed of a compound, the compound including metal with no more than a divalence and a metal compound having anions, a solid electrolyte layer formed on the first electrode, and a second electrode formed on the solid electrolyte layer.

In an example embodiment, a method of manufacturing a resistive random access memory (RRAM) may include forming a first electrode on a substrate, the first electrode formed of a compound, the compound including metal with no more than a divalence and a metal compound having anions, forming a solid electrolyte layer on the first electrode, and forming a second electrode on the solid electrolyte.

BRIEF DESCRIPTION OF THE DRAWINGS

The above and other features of example embodiments of the present invention may become more apparent with the description of example embodiments thereof with reference to the attached drawings in which.

DETAILED DESCRIPTION

Figure 1:
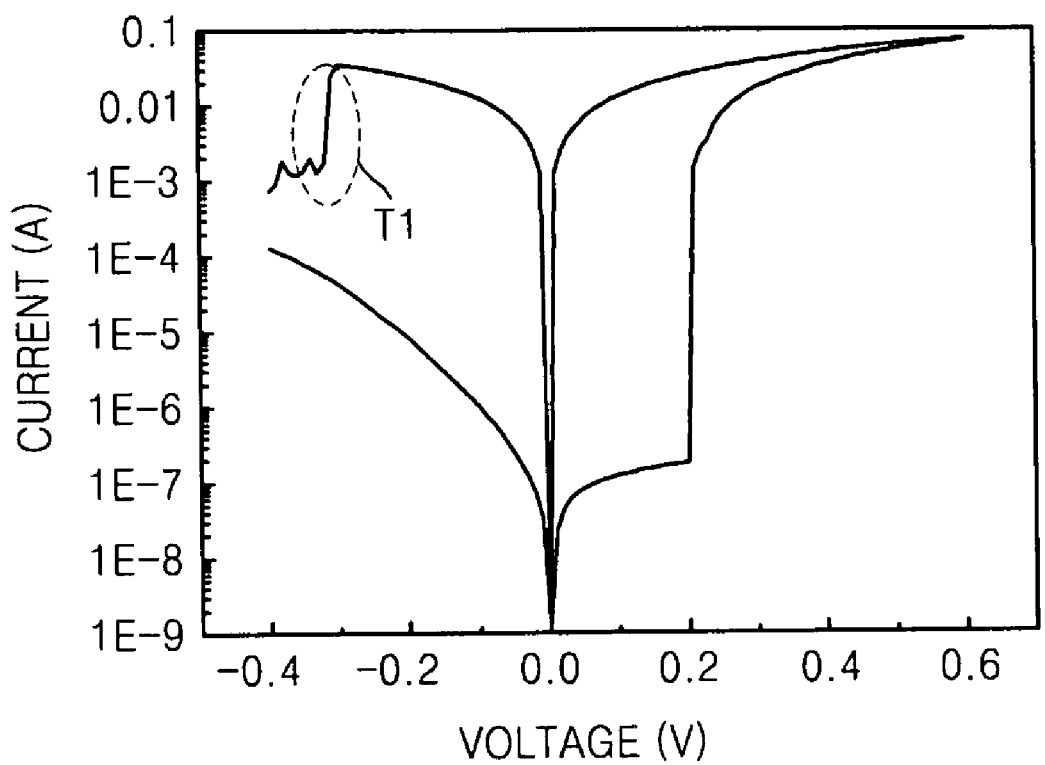
FIG. 1 is a graph illustrating current-voltage characteristics of a conventional resistive random access memory (RRAM) device.

Example embodiments of the present invention will now be described more fully with reference to the accompanying drawings, in which example embodiments of the present invention may be shown.

It will be understood that when an element or layer is referred to as being "on", "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there may be no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms may be only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a", "an" and "the" may be intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments may be described herein with reference to cross-section illustrations that may be schematic illustrations of idealized embodiments (and intermediate structures). As such, variations from the shapes of the illustrations as a result, for example, of manufacturing techniques and/or tolerances, are to be expected. Thus, the example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to limit the example embodiments.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
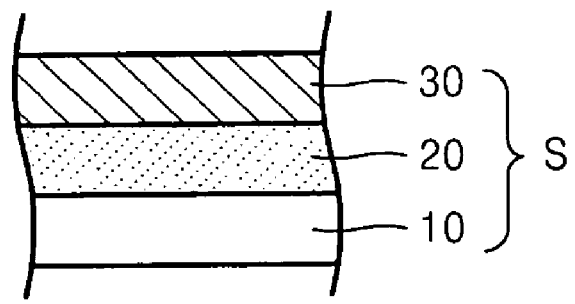
FIG. 2 is a cross-sectional view illustrating a portion of a storage node included in an RRAM according to an example embodiment of the present invention.

FIG. 2 is a cross-sectional view illustrating a portion of a storage node S included in a resistive random access memory (RRAM) device according to an example embodiment of the present invention.

Referring to FIG. 2, a lower electrode 10, a solid electrolyte layer 20, and an upper electrode 30 may be sequentially stacked to form the storage node S of the RRAM.

The lower electrode 10 may include metal with a divalence or less (i.e., no more than a divalence) and a metal compound having anions. The metal may include one of Cu, Ag, Li, and Zn, and the metal compound may be a metal nitride, for example, TaN, TiN, or WN or a metal oxide, for example, $RuO_2$ or $ZrO_2$. The lower electrode 10 will be described in more detail later.

The solid electrolyte layer 20 may be a metal compound including one of S, Se, and Te or a metal oxide with a trivalence or more, for example, $AlO_X$ or $WO_3$. The upper electrode 30 may be metal, for example, Pt, Ru or $IrO_2$. The upper electrode 30 is not a metal including Cu, Ag, Li, and Zn.

The lower electrode 10 and the upper electrode 30 may be formed as wires crossing each other at right angles. In this case, the solid electrolyte layer 20 may have the form of the lower electrode 10. The lower electrode 10 and the upper electrode 30 may also be something other than wires, such as, dotted patterns, and in such a case, the bottom electrode 10, the solid electrolyte layer 20, and the top electrode 30 may be formed to a similar width. The lower electrode 10, the solid electrolyte layer 20, and the upper electrode 30 may have various shapes.

Hereinafter, the lower electrode 10 will be described in more detail.

As described above, the lower electrode 10 of the RRAM according to the example embodiment of the present invention may include a metal with a divalence or less and a metal compound having anions. The lower electrode 10 may be a nanocomposite including the metal and the metal compound or a nanolaminate in which the metal compound and the metal are alternately laminated. The amount X of the metal in the nanocomposite may be $15 \leq X < 100$ atomic %, and the thickness of the nanocomposite may be from 100 to 1000 Å. A first layer and a last layer of the nanolaminate may be respectively formed of the metal compound and the metal. The thickness of the nanolaminate may be 100 to 1000 Å, and at least two layers of the nanolaminate may be formed of the metal.

The metal may function as an ion source, and the metal compound may suppress excessive diffusion of the metal. For example, when the lower electrode 10 is a nanocomposite including TaN and Cu, and the lower electrode 10 is ionized, excessive diffusion of Cu ions, which are cations, may be suppressed by N ions, which are anions. Also, the lower electrode 10 may be formed of the nanocomposite or the nanolaminate including the metal compound, which is not a single layer formed of Cu or Ag, and thus may be easily formed using a conventional etching method, for example, a reactive ion etching (RIE) method.

Meanwhile, the bottom electrode 10 may have another structure other than the nanocomposite or the nanolaminate structures. For example, a groove may be formed in a layer formed of the metal compound, and the groove may be filled with the metal. The depth of the groove may be from several to several tens of nms. In this case, the layer formed with the metal compound may be wider than the solid electrolyte layer 20, and the solid electrolyte layer 20 may be formed on the metal filled in the groove.

Figure 3:
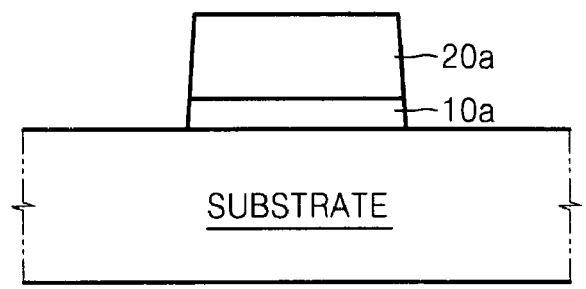
FIG. 3 illustrates a storage node having a stack pattern in which a lower electrode formed of a nanocomposite and a solid electrolyte layer are sequentially stacked according to an example embodiment of the present invention.

FIG. 3 illustrates a stack pattern in which a lower electrode 10a formed of the nanocomposite and a solid electrolyte layer 20a are sequentially stacked, according to an example embodiment of the present invention. The lower electrode 10a may be formed of TaNCu, which may be formed by a sputtering method using a TaN source target and a Cu source target. The solid electrolyte layer 20a may be formed of GeTe. The patterning of the stack pattern may be performed using a conventional dry etching method.

Referring to FIG. 3, etching surfaces of the lower electrode 10a and the solid electrolyte layer 20a may be almost at right angles with the surface of the substrate. Accordingly, the lower electrode 10a including Cu may be easily formed by a conventional etching method.

In example embodiments, the lower electrode 10b, may be formed of a nanolaminate, for example, TaN layer and Cu layer, respectively. The thickness of the TaN layer and the Cu layer may be about 50 Å, respectively.

In example embodiments, a nanocomposite of Cu and TaN may be partially formed at an interface between the Cu layer and the TaN layer. In detail, the lower electrode 10b, which may be formed of the nanolaminate, may include the nanocomposite of the metal (Cu) and the metal compound (TaN).

Figure 4:
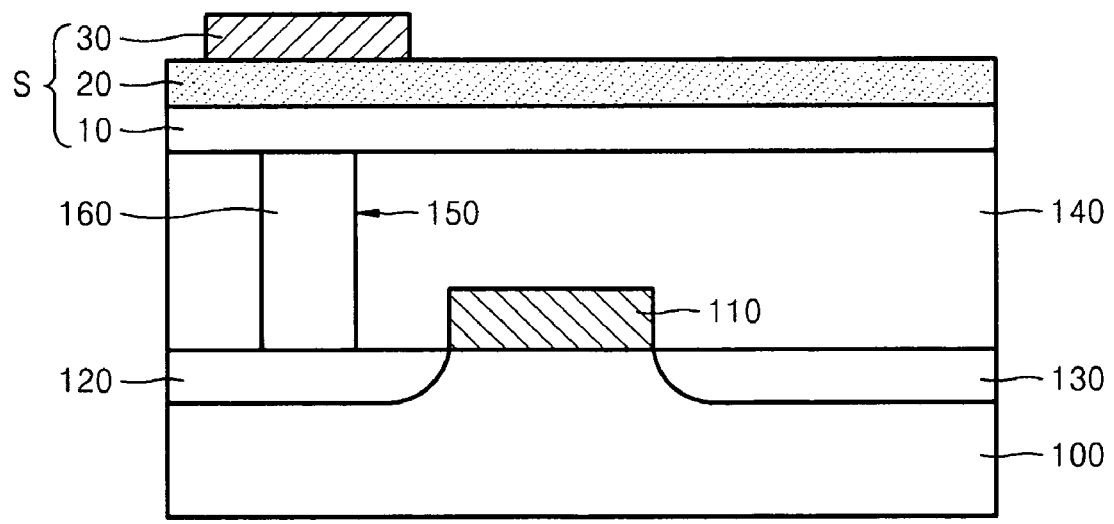
FIG. 4 is a cross-sectional view of an RRAM including the storage node of FIG. 2 according to an example embodiment of the present invention.

FIG. 4 is a cross-sectional view of an RRAM including the storage node S of FIG. 2 according to an example embodiment of the present invention.

Referring to FIG. 4, a gate 110 may be formed on a substrate 100, and first and second impurities regions 120 and 130 may be formed on both sides of the gate 110. One of the first and second impurities regions 120 and 130 may be a source, and the other may be a drain. The gate 110 and the first and second impurity regions 120 and 130 may constitute a transistor. An interlayer insulating layer 140 covering the transistor may be formed on the substrate 100. A contact hole 150 exposing the first impurity region 120 may be formed in the interlayer insulating layer 140, and the contact hole 150 may be filled with a conductive plug 160. The storage node S covering the exposed portion of the conductive plug 160 may be formed on the interlayer insulating layer 140. A lower electrode 10 and the solid electrolyte layer 20 of the storage node S may be formed as vertical wires with respect to the gate 110, and an upper electrode 30 may be formed as a wire crossing the bottom electrode 10 at a right angle above the conductive plug 160. Although not illustrated in the drawings, a bit line, which electrically contacts with the second impurity region 130, may be formed. The voltage that is applied to the gate 110, the upper electrode 30, and the bit line determines whether a current path is formed or not in the solid electrolyte layer 20.

Figure 5:
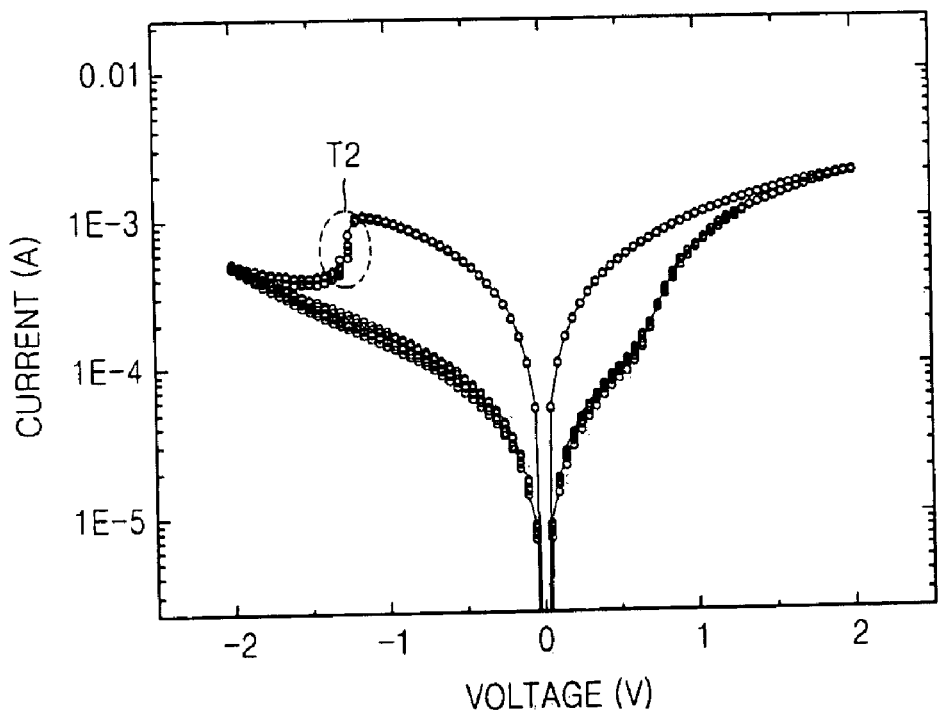
FIG. 5 is a graph illustrating current-voltage characteristics of an RRAM according to an example embodiment of the present invention.

FIG. 5 is a graph illustrating current-voltage characteristics of an RRAM including the storage node S formed of the nanocomposite according to an example embodiment of the present invention. A section T2 illustrates where current of the RRAM abruptly changes, that is, where a resistance of the RRAM abruptly changes.

Referring to FIG. 5, the resistance of the RRAM abruptly changes at about −1.3V and as such indicates that the absolute value of the operation voltage of the RRAM according to the example embodiment of the present invention is about 1.3V.

Comparing FIGS. 1 and 5, the absolute value of the operation voltage of the conventional RRAM is about 0.3 V, which is very low in comparison to the absolute value of the operation voltage of the RRAM according to the example embodiment of the present invention of about 1.3 V. Thus, due to the increase in the operation voltage of the RRAM, it may be easier to control the operation of the RRAM device.

In addition, a horizontal width of the graph in the section T2 where the resistance abruptly changes is not large, and as such may indicate that the voltage distribution where the resistance changes in the RRAM is very narrow.

Figure 6:
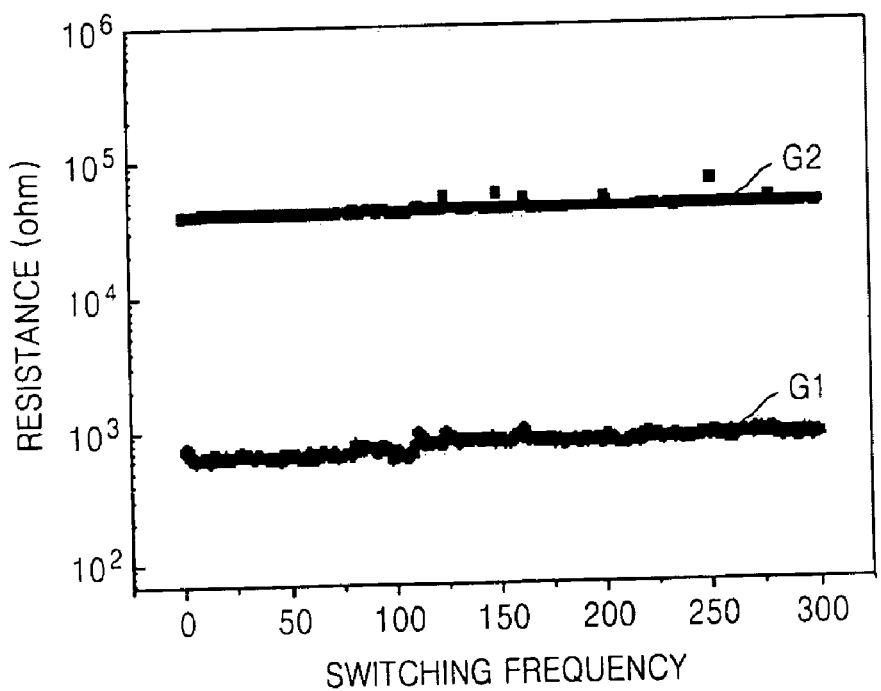
FIG. 6 is a graph illustrating resistance variations of an RRAM according to switching frequencies according to example embodiments of the present invention.

FIG. 6 is a graph illustrating resistance variations of an RRAM versus switching frequencies according to an example embodiment of the present invention. A first graph G1 illustrates the resistance state when there is a current path in the solid electrolyte layer 20a, and thus corresponds to a low resistance state. A second graph G2 represents a resistance state when there is no current path in the solid electrolyte layer 20a, and thus corresponds to a high resistance state.

Referring to FIG. 6, the resistance values of the low resistance state and the high resistance state are distinctively different and are constantly maintained regardless of the switching frequencies. This may indicate that the switching operation of the RRAM according to the example embodiment of the present invention is very stable. That is, even when the bottom electrode 10 is not only formed of Cu or Ag but of the nanocomposite or the nanolaminate structures, the switching characteristic of the RRAM may be excellent.

As described above, the RRAM according to example embodiments of the present invention may include a lower electrode formed of metal with a divalence or less, for example, Cu or Ag and a metal compound suppressing excessive diffusion of the metal. Accordingly, the operation voltage of the RRAM according to the example embodiment of the present invention may be set in a range to easily control the RRAM, and a malfunction due to excessive diffusion of Cu or Ag ions may be prevented.

Also, the lower electrode of the RRAM according to example embodiments of the present invention may be formed of a nanocomposite including metal and a metal compound or a nanolaminate in which the metal compound and the metal may be alternately laminated, and in such case, the bottom electrode may be easily etched using a conventional etching method. Accordingly, the RRAM according to the example embodiments of the present invention may be easily manufactured. While example embodiments of the present invention have been particularly shown and described, the example embodiments of the present invention may, however, be embodied in many different forms and should not be construed as being limited to the example embodiments set forth herein. For example, the positions of a lower electrode 10 and an upper electrode 30 of the storage node S illustrated in FIGS. 2 and 4 may be changed, and the elements constituting the storage node S may be other elements.

What is claimed is:

1. A resistive random access memory (RRAM) device, comprising a switching device and a storage node that is connected to the switching device, wherein the storage node comprises:

a first electrode formed of a compound, the compound including metal with no more than a divalence and a metal compound having anions;

a solid electrolyte layer formed on the first electrode; and a second electrode formed on the solid electrolyte layer.

2. The RRAM of claim 1, wherein the first electrode is a nanocomposite.

3. The RRAM of claim 2, wherein an amount (X) of the metal in the nanocomposite is $15 \leq X < 100$ atomic%.

4. The RRAM of claim 2, wherein the thickness of the nanocomposite is 100 to 1000 Å.

5. The RRAM of claim 1, wherein the first electrode is a nanolaminate.

6. The RRAM of claim 5, wherein the nanolaminate is alternately formed of a metal layer and a metal compound layer, the metal layer formed of the metal and the metal compound layer formed of the metal compound.

7. The RRAM of claim 6, wherein a first layer of the nanolaminate is formed of the metal compound layer, and a last layer of the nanolaminate is formed of the metal layer.

8. The RRAM of claim 7, wherein at least two layers of the nanolaminate are formed of the metal layer.

9. The RRAM of claim 1, wherein the metal of the first electrode is one of Cu, Ag, Zn and Li.

10. The RRAM of claim 1, wherein the metal compound of the first electrode is a metal nitride.

11. The RRAM of claim 1, wherein the metal compound of the first electrode is a metal oxide.

12. The RRAM of claim 1, wherein the metal compound is a metal compound layer, the metal compound layer has a groove formed therein, and the metal fills at least a portion of the groove.

* * * * *